(12) United States Patent
Shigehiro et al.

(10) Patent No.: US 7,550,753 B2
(45) Date of Patent: Jun. 23, 2009

(54) CHARGED PARTICLE GENERATOR AND ACCELERATOR

(75) Inventors: Nishino Shigehiro, Kyoto (JP); Ono Ryoichi, Kyoto (JP)

(73) Assignee: Kyoto Institute of Technology (JP)

( * ) Notice: Subject to any disclaimer, the term of this patent is extended or adjusted under 35 U.S.C. 154(b) by 207 days.

(21) Appl. No.: 11/770,037

(22) Filed: Jun. 28, 2007

(65) Prior Publication Data
US 2008/0067410 A1    Mar. 20, 2008

Related U.S. Application Data

(63) Continuation of application No. PCT/JP2005/023787, filed on Dec. 26, 2005.

(51) Int. Cl.
*H01J 27/00* (2006.01)
(52) U.S. Cl. .................................. 250/505.1
(58) Field of Classification Search .............. 250/505.1, 250/493.1, 492.3, 423 R
See application file for complete search history.

(56) References Cited

U.S. PATENT DOCUMENTS 3,849,656 A * 11/1974 Wallington ................. 250/424
4,942,304 A *  7/1990 Boston ..................... 250/492.3

* cited by examiner

*Primary Examiner*—Kiet T Nguyen
(74) *Attorney, Agent, or Firm*—Thomas, Kayden, Horstemeyer & Risley LLP.

(57) ABSTRACT

A charged particle generator includes a charged particle source provided inside an insulating member which comprises a first box-shaped insulating member having an opening at its top; a second box-shaped insulating member housed inside the first box-shaped insulating member and having an opening at its top, and side walls and a bottom portion which are respectively spaced from side walls and a bottom portion of the first box-shaped insulating member; and an inverted box-shaped insulating member having an opening at its bottom and side walls which are inserted into the space between the side walls of the first and second box-shaped insulating members.

5 Claims, 12 Drawing Sheets

| 1 | Charged particle generator |
| 2 | Charged particle source (Ion source) |
| 4 | First box-shaped insulating member |
| 5 | Second box-shaped insulating member |
| 6 | Insulating lid member |
| 7 | Inverted box-shaped insulating member |

CHARGED PARTICLE GENERATOR AND ACCELERATOR

CROSS-REFERENCE TO RELATED APPLICATION

This application is a continuation application which claims priority to PCT Application No. JP2005/023787, filed Dec. 26, 2005, which claims priority to Japanese Patent Application No. P2004-381213, filed on Dec. 28, 2004.

TECHNICAL FIELD

The present invention relates to a charged particle generator for generating charged particles and an accelerator comprising the charged particle generator and an acceleration tube for accelerating charged particles, generated from the generator, by application of an acceleration voltage.

BACKGROUND ART

As this kind of techniques conventionally known are a charged particle generator for generating charged particles (e.g. ions or electrons) from a charged particle source by means of a raw material gas and a high voltage, and an accelerator comprising the charged particle generator and an acceleration tube for accelerating charged particles, emitted from the generator, by application of an acceleration voltage. Above all known is a multi-stage acceleration type accelerator (e.g. see Patent Document 1) in which a plurality of acceleration electrodes are provided in a direction of a shaft center at predetermined spacings on the inner peripheral face of a cylindrical acceleration tube body, the adjacent acceleration electrodes are connected by a voltage dividing resistor, and a voltage obtained by dividing an acceleration voltage applied between the acceleration electrodes at each end is applied between the adjacent acceleration electrodes, to accelerate at multiple stages charged particles emitted from the charged particle generator.

In such an accelerator, high voltage resistant insulation needs to be performed for preventing discharge from the charged particle source to the outside of the charged particle generator and discharge over the surface of the voltage dividing resistor, and hence the charged particle source and the acceleration tube are typically sealed by a voltage resistant insulating gas such as SF6.

Patent Document 1: Japanese Patent Laid-Open No. H11-25900

DISCLOSURE OF THE INVENTION

However, while it is necessary to create the high insulating atmosphere as described above since a high voltage is applied to the charged particle source and between the acceleration electrodes for the purpose of accelerating the charged particles, and for some other purposes, it is also important to make the charged particle generator and the acceleration tube have configurations resistant to generation of discharge to the outside of the charged particle generator and discharge over the surface of the voltage dividing resistor provided in the acceleration tube.

The present invention was made in view of the above problem, and has an object to provide a charged particle generator having a configuration resistant to generation of outside discharge, and an accelerator comprising the generator and an acceleration tube for accelerating charged particles by application of an acceleration voltage.

In order to achieve the above object, a charged particle generator according to claim 1 is characterized in that a charged particle source is provided inside an insulating member comprised of: a first box-shaped insulating member, having an opening at its top; one or more interiorly housed insulating members, each of which is housed inside the first box-shaped insulating member and has an opening at its top, and whose side walls and bottom portions are spaced at a predetermined distance from the outside adjacent side walls and bottom portion of the first box-shaped insulating member; and one or more inverted box-shaped insulating members, each having an opening at its bottom such that each of its side walls is inserted into the space between the side walls of the first box-shaped insulating member and the one or more interiorly housed box-shaped insulating member.

A charged particle generator according to claim 2 comprises: a first box-shaped insulating member, having an opening at its top; a second insulating members, which is housed inside the first box-shaped insulating member and has an opening at its top, and whose side wall and bottom portion are spaced at a predetermined distance from the outside adjacent side wall and bottom portion of the first box-shaped insulating member; and an inverted box-shaped insulating members, having an opening at its bottom such that each of its side walls is inserted into the space between the sidewalls of the first and second box-shaped insulating members, characterized in that charged particles generated from a charged particle source installed inside the second box-shaped insulating member are emitted through emerging holes formed in the bottom portions of the first and second box-shaped insulating members.

A charged particle generator according to claim 3 is characteristic in that the charged particle generator according to claim 2 further comprises an insulating lid member with its edges placed on the upper ends of the side walls of the second box-shaped insulating member so as to close the top-opening of the second box-shaped insulating member.

A charged particle generator according to claim 4 is characterized in that in the charged particle generator according to claim 3, the first box-shaped insulating member, the second box shaped insulating member, the insulating lid member and the inverted box-shaped insulating member are formed of polypropylene or polyethylene.

An accelerator according to claim 5 comprises: the charged particle generator according to any one of claims 1 to 4; and an acceleration tube for accelerating charged particles, emitted from the generator, by application of an acceleration voltage, characterized by comprising: a cylindrically formed acceleration tube body made of a synthetic resin; a plurality of ring-shaped acceleration electrodes provided as arranged in a row in a direction of a shaft center of the acceleration tube body at predetermined spacings on the inner peripheral face of the acceleration tube body; a voltage dividing resistor for an acceleration tube, which serially connects a plurality of resistors, covers the plurality of resistors by an insulating heat-shrinkable tube extending in the connecting direction, and is spirally wound on the outer peripheral face of the acceleration tube body; and a plurality of terminal members, which are provided through the acceleration tube body in its diameter direction and in intimate contact with the acceleration tube body, whose front ends are electrically connected to the acceleration electrodes, and whose rear ends are electrically connected to connecting points of the voltage dividing resistors for an acceleration tube.

As per the charged particle generator according to claim 1, the use of the box-shaped insulating members and the inverted box-shaped insulating member makes a channel from the charged particle source to the outside long, thereby allowing enhancement of an outside discharge preventing effect. This can lead to prevention of discharge from the charged particle source, to which a high voltage is applied, to the outside and hence it is advantageously unnecessary to seal the charged particle source by a voltage resistant insulating gas such as SF6.

As per the charged particle generator according to claim 2, in addition to the effect of the charged particle generator according to claim 1, formation of the first box-shaped insulating member, the second box-shaped insulating member and the inverted box-shaped insulating member in appropriate sizes in accordance with a value of a voltage supplied from a voltage source to the charged particle source allows effective prevention of discharge from the charged particle source to the outside of the charged particle generator. Further, since a user can get the inside of the charged particle generator open just by lifting the inverted box-shaped insulating member, it is advantageously possible to readily perform setting and maintenance of the charged particle source and the like.

As per the charged particle generator according to claim 3, in addition to the effect of the charged particle generator according to claim 2, since the insulating lid member is placed above the second box-shaped insulating member, it is possible to readily close the top-opening of the second box-shaped insulating member and enhance a discharge preventing effect.

As per the charged particle generator according to claim 4, in addition to the effect of the charged particle generator according to claim 3, since the insulating properties of the first box-shaped insulating member, the second box-shaped insulating member and the inverted box-shaped insulating member are higher than that of a typical insulator, it is possible to enhance the discharge preventing effect.

As per the accelerator according to claim 5, since the channel from the charged particle source to the outside is long, formation of the first box-shaped insulating member, the second box-shaped insulating member and the inverted box-shaped insulating member in appropriate sizes in accordance with a value of a voltage supplied from the voltage source to the charged particle source allows effective prevention of discharge from the charged particle source to the outside of the charged particle generator. Further, since a plurality of resistors are covered by an insulating heat-shrinkable tube, generation of discharge over the surface of the resistor can be prevented without sealing of the acceleration tube by a voltage resistant insulating gas such as SF6.

DESCRIPTION OF REFERENCE NUMERALS

Figure 1:
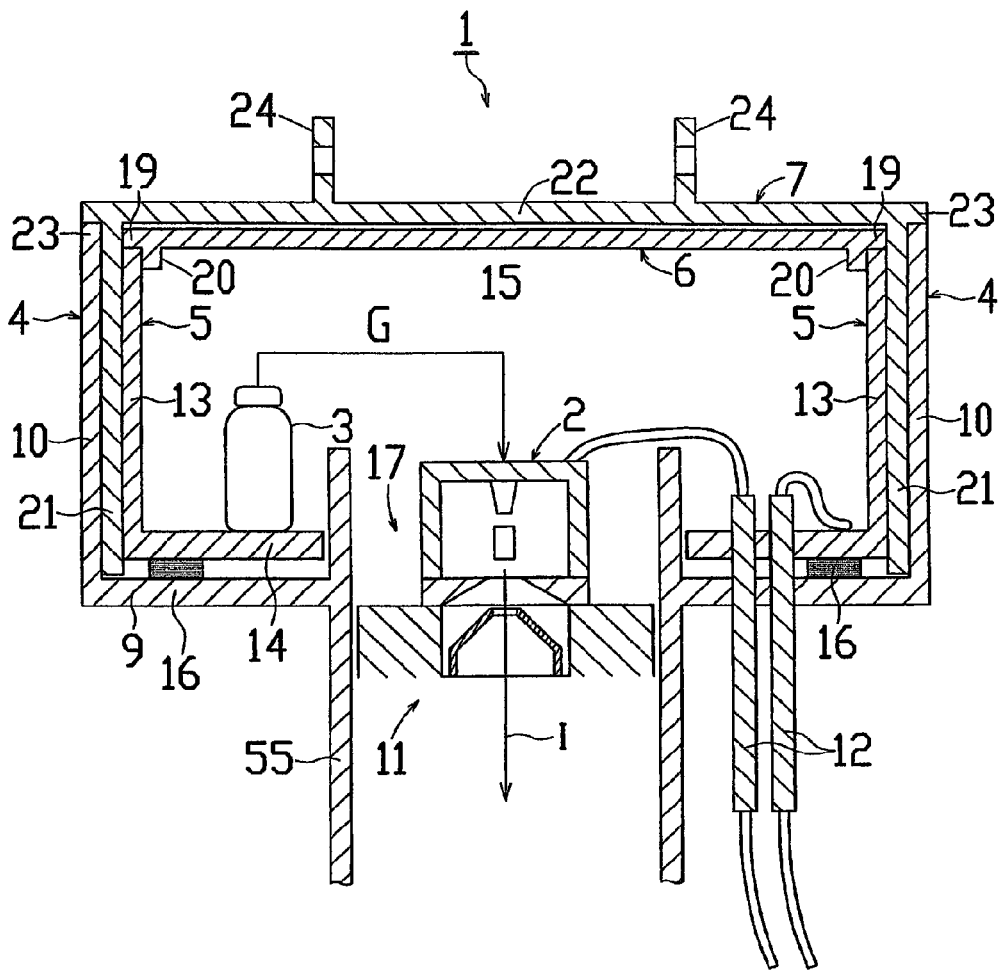
FIG. 1 is a sectional view of a charged particle generator according to an embodiment of the present invention.

1. Charged particle generator
2. Ion source (charged particle source)
4. First box-shaped insulating member
5. Second box-shaped insulating member
6. Insulating lid member
7. Inverted box-shaped insulating member
9, 14, Bottom portion
10, 13, 21. Side wall
11, 17. Emerging hole
26. Accelerator
27. Acceleration tube body
28. Acceleration electrode
29. Terminal bolt (Terminal member)
30. Voltage dividing resistor (voltage dividing resistor for acceleration tube)
40. Insulating heat-shrinkable tube

BEST MODE FOR CARRYING OUT THE INVENTION

Figure 2:
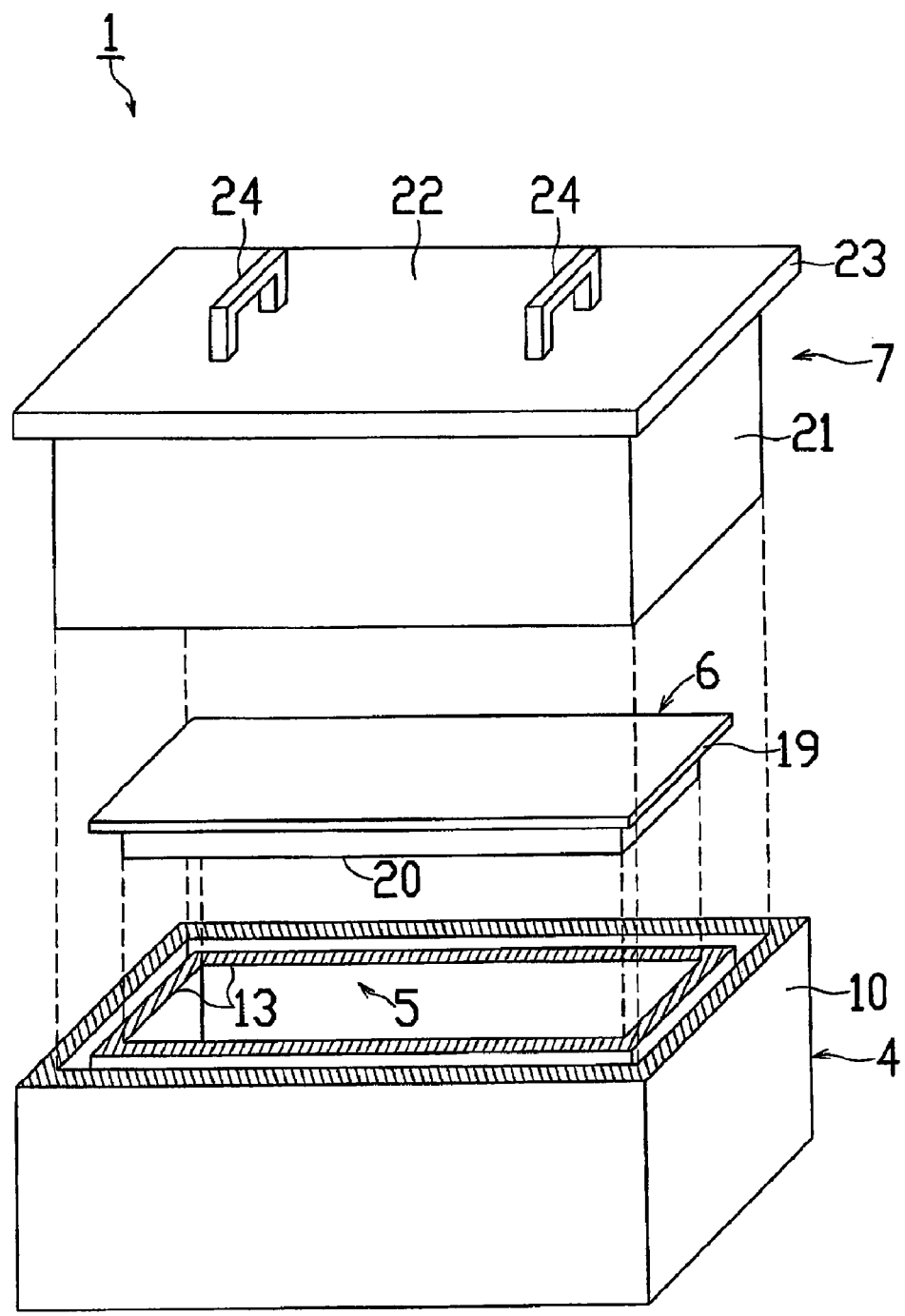
FIG. 2 is an oblique view of a first box-shaped insulating member, a second box-shaped insulating member, an insulating lid member, and an inverted box-shaped insulating member.

In the following, an embodiment of the present invention is described based upon drawings. A charged particle generator (ion generator) 1 according to the embodiment of the present invention shown in FIGS. 1 and 2 is a device for generating charged particles (ions in this embodiment) from a charged particle source 2, and comprises: the charged particle source (hereinafter referred to as "ion source") 2; a gas cylinder 3 for supplying the ion source 2 with a raw material gas G for generating ions I; a voltage source (not shown) for applying a high voltage needed for generation of the ions I to the ion source 2; and some other constituents. It should be noted that the ion source 2, the gas cylinder 3 and the like are not shown in FIG. 2. Further, although the charged particle generator 1 according to the present embodiment is to supply the ion source 2 with the raw material gas G to generate ions, the ion generating means is not restricted to this, but the surface of a solid row material may be sputtered to generate ions.

The charged particle generator 1 further comprises a first box-shaped insulating member 4, a second box-shaped insulating member 5, an insulating lid member 6, and an inverted box-shaped insulating member 7.

The first box-shaped insulating member 4 is a box-shaped insulating member having an opening at its top, in which a bottom portion 9 is formed to have a thickness of about 15 mm, four walls 10 are formed to have a thickness of about 10 mm, and an emerging hole 11 for emitting the ions I generated from the ion source 2 is formed in the bottom portion 9. This first box-shaped insulating member 4 is preferably formed by integral molding of the bottom portion 9 and the four side walls 10, but may also be formed by fusion. However, in that case, the formation needs to be made with caution not to generate bubbles since, if bubbles are included in the joint portion, charge might occur therefrom to the outside. Further, the bottom portion 9 is joined by fusion with an insertion member 12, which is cylindrically formed so that a power supply line for supplying a power source with power or a variety of control lines can be inserted thereinto.

The second box-shaped insulating member 5 is a box-type insulating member, which is housed inside the first box-shaped insulating member 4 and has an opening at its top, and whose side walls 13 and bottom portion 14 are spaced at a predetermined distance from the outside adjacent side walls 10 and bottom portion 9 of the first box-shaped insulating member 4, and as described later, the insulating lid member 6 is placed so as to close a top-opening 15 of the second box-shaped insulating member 5. This second box-shaped insulating member 5 is formed in the same shape and same manner as the first box-shaped insulating member 4 such that its bottom portion 14 has a thickness of about 15 mm and its side walls 13 have a thickness of about 10 mm.

The second box-shaped insulating member 5 is placed on the supporting members 16 installed in the vicinity of four corners of the rectangular bottom portion 9 of the first box-shaped insulating member 4, and is thereby housed inside the first box-shaped insulating member 4 such that the bottom portion 14 is spaced from the bottom portion 9 of the first box-shaped insulating member 4 at a predetermined distance (distance corresponding to the height of the supporting member 16), and an emerging hole 17 for emitting the ions I generated from the ion source 2 is formed in the same manner as the first box-shaped insulating member 4. Further, the ion source 2, the voltage source, the gas cylinder 3 and the like are installed inside the second box-shaped insulating member 5, and the charged particle generator 1 emits charged particles generated from the ion source (charged particle source) 2 installed inside the second box-shaped insulating member 5 through the emerging holes 11 and 17 formed respectively in the bottom portions 9 and 14 of the first and second box-shaped insulating members 4 and 5.

The insulating lid member 6 is a tabular insulating member with its edges 19 placed on the upper ends of the side walls 13 of the second box-shaped insulating member 5, so as to close the top-opening (top-opening 15) of the second box-shaped insulating member 5, and is formed so as to have a thickness of about 15 mm. Further, locking portions 20 are formed on the lower face of the insulating lid member 6 in the state of being placed on the upper ends of the side walls 13 of the second box-shaped insulating member 5 so as to prevent the insulating lid member 6 from moving in a horizontal direction and the edge 19 from protruding from the outer side face of the side wall 13 of the second box-shaped insulating member 5. It is to be noted that, since the side wall 21 of the inverted box-shaped insulating member 7 is inserted from above into the space between the sidewall 10 of the first box-shaped insulating member 4 and the side wall 13 of the second box-shaped insulating member 5 as shown in FIG. 1, the insulating lid member 6 is formed into such a size that the edge 19 does not to protrude outside in the horizontal direction from the outer side face of the side wall 13 of the second box-shaped insulating member 5.

The inverted box-shaped insulating member 7 is an inverted box-shaped insulating member having an opening at its bottom such that each of its side walls 21 is inserted into the space between the side walls 10 and 13 of the two adjacent first and second box-shaped insulating members 4 and 5, and is formed in the same manner as the first box-shaped insulating member 4 and the like so as to have the top portion 22 with a thickness of about 15 mm and the four side walls 21 with a thickness of about 10 mm. Therefore, a slant distance between the side wall 13 of the second box-shaped insulating member 5 and the side wall 10 of the first box-shaped insulating member 4 is about ten-odd mm. Further, the locking members 23 are formed at portions where the top portion 22 intersects with the side walls 21, and the locking members 23 are placed on the uppers end of the side wall 10 of the first box-shaped insulating member 4 so that the top-opening of the first box-shaped insulating member 4 is closed by the inverted box-shaped insulating member 7. Moreover, as shown in FIG. 1, a handle 24 is formed on the top portion 22 so as to be readily lifted by the user in a state where the side wall 21 is inserted in the space between the side wall 13 of the second box-shaped insulating member 5 and the side wall 10 of the first box-shaped insulating member 4 and the top portion 22 is placed on the insulating lid member 6.

It is to be noted that, although a material for the first box-shaped insulating member 4, the second box-shaped insulating member 5, the insulating lid member 6 and the inverted box-shaped insulating member 7 is not restricted so long as being an insulating material, it is preferable to form those members of polypropylene (PP), polyethylene (PE) or the like. Further, although the first box-shaped insulating member 4, the second box-shaped insulating member 5 and the inverted box-shaped insulating member 7 are in square (quadrangle) shape in the present embodiment, the shapes of those members are not restricted to square but, for example, even members in other shapes, such as a cylindrical shape, each having an opening either at its top portion or bottom portion may be applied so long as covering the charged particle source, and those members can also be included in the first and second box-shaped insulating members 4 and 5 and the inverted box-shaped insulating member 7.

FIG. 2 is an oblique view showing the first box-shaped insulating member 4, the second box-shaped insulating member 5, the insulating lid member 6, and the inverted box-shaped insulating member 7 in a state where the top-opening 15 of the second box-shaped insulating member 5 is open. As shown in the figure, in a state where the top-opening 15 of the second box-shaped insulating member 5 is open, the user sets the ion source 2, the voltage source, the gas cylinder 3 and the like, which are not shown in the figure, inside the second box-shaped insulating member 5, subsequently places the insulating lid member 6 on the upper ends of the side walls 13 of the second box-shaped insulating member 5, and further places the inverted box-shaped insulating member 7 on the upper ends of the side walls 10 of the first box-shaped insulating member 4 so as to insert the side walls 21 of the inverted box-shaped insulating member 7 between the side walls 13 of the second box-shaped insulating member 5 and the side walls 10 of the first box-shaped insulating member 4, thereby allowing easy closing of the first box-shaped insulating member 4 and the second box-shaped insulating member 5.

Figure 3:
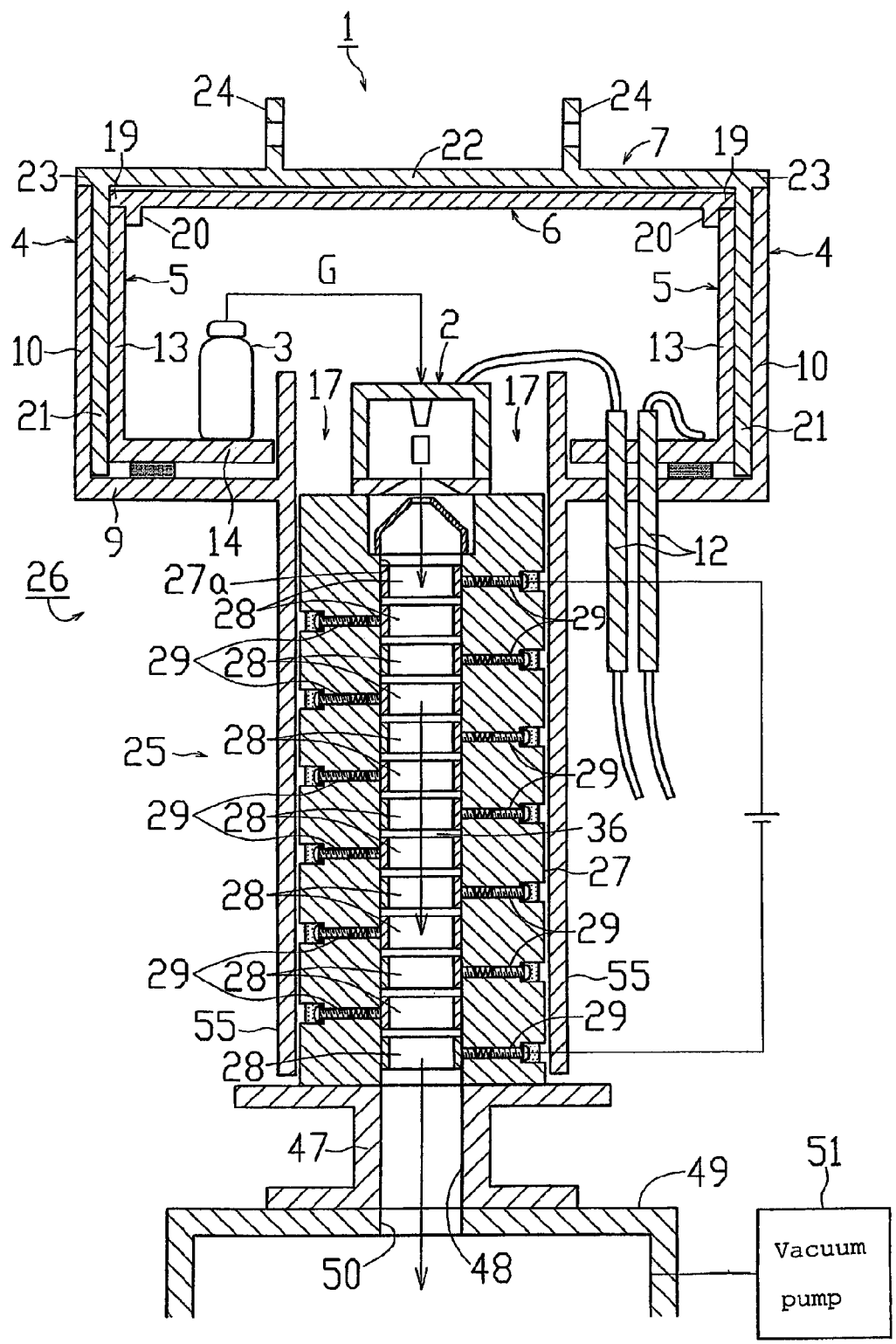
FIG. 3 is a sectional view of an accelerator according to an embodiment of the present invention.
Figure 4:
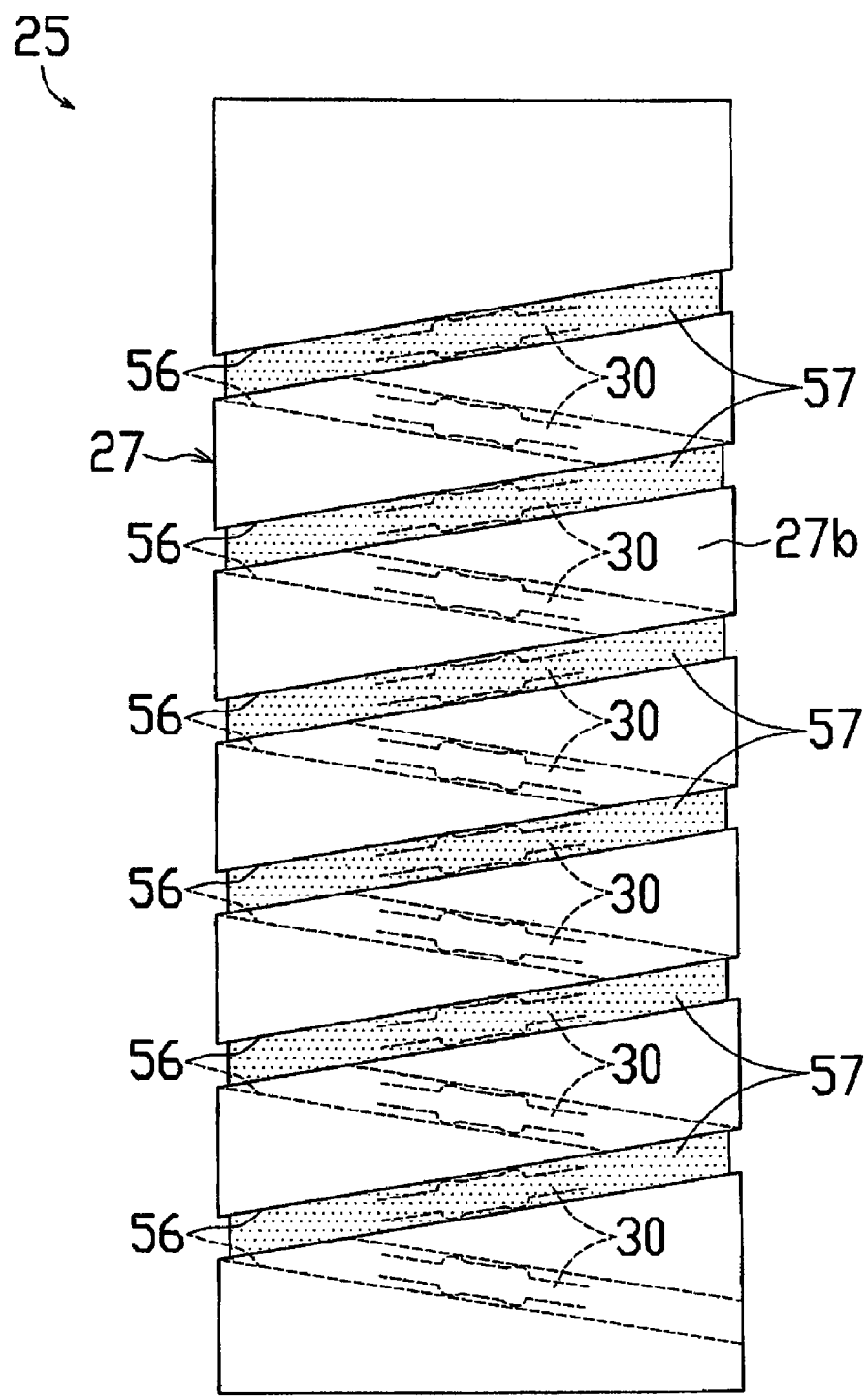
FIG. 4 is a front view of an acceleration tube.

As shown in FIG. 3, the charged particle generator 1 as thus configured can be used in an accelerator 26 comprising the charged particle generator 1 and an acceleration tube 25 for accelerating the ions I (charged particles) emitted from the generator 1. As shown in FIGS. 3 to 7, the acceleration tube 25 comprises the acceleration tube body 27, a plurality of acceleration electrodes 28, a plurality of terminal bolts (terminal members) 29 and a plurality of voltage dividing resistors (voltage dividing resistors for an acceleration tube) 30.

The acceleration tube body 27 is made of a synthetic resin and has a high voltage resistance, and is formed in a cylindrical shape having an outside diameter of about 120 mm, an inside diameter of about 40 mm, a thickness of about 40 mm and a length of about 300 mm. Examples of the synthetic resin constituting this acceleration tube body 27 may include polytetrafuloroethylene [PTFE, e.g. Teflon (brand name)], polyethylene (PE), polypropylene (PP) and polystyrene (PS). It is to be noted that an inside diameter, an outside diameter, a thickness, a length and the like of the acceleration tube body 27 are not particularly restricted, but are changeable as appropriate according to need.

Figure 5:
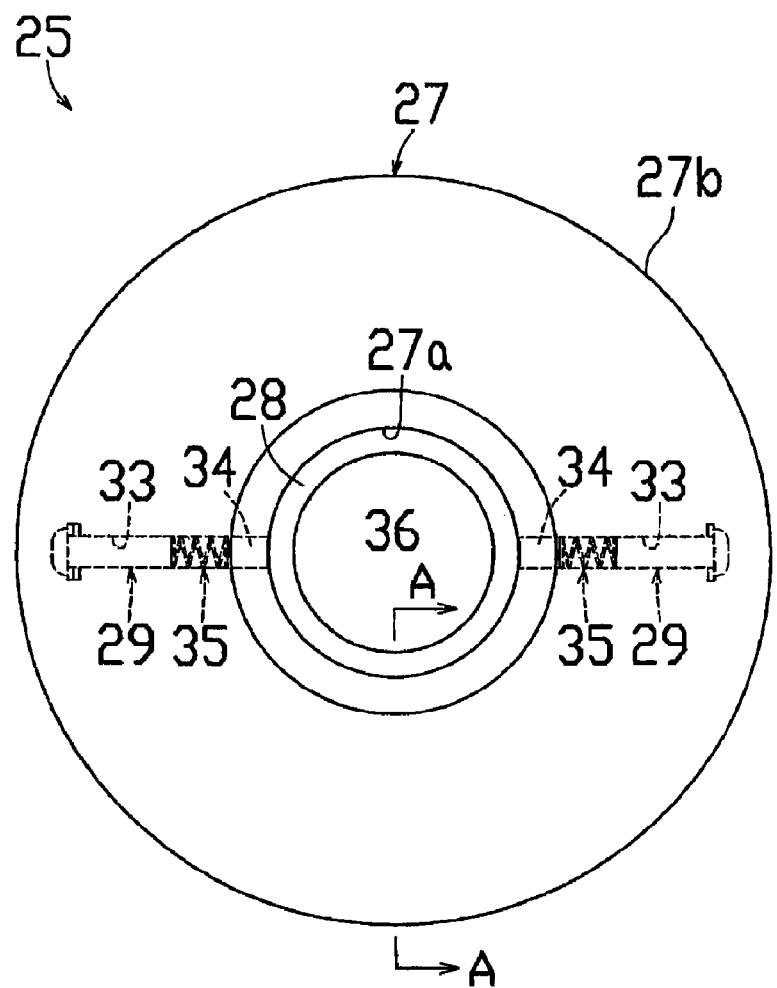
FIG. 5 is a plane view of the acceleration tube.

As shown in FIG. 5, the acceleration electrode 28 is formed in ring shape so as to be in intimate contact with an inner peripheral face 27a of the acceleration tube body 27. As shown in FIG. 3, a plurality of acceleration electrodes 28 are provided as arranged in a row in a direction of a shaft center of the acceleration tube body 27 at predetermined spacings on the inner peripheral face 27a of the acceleration tube body 27.

Figure 6:
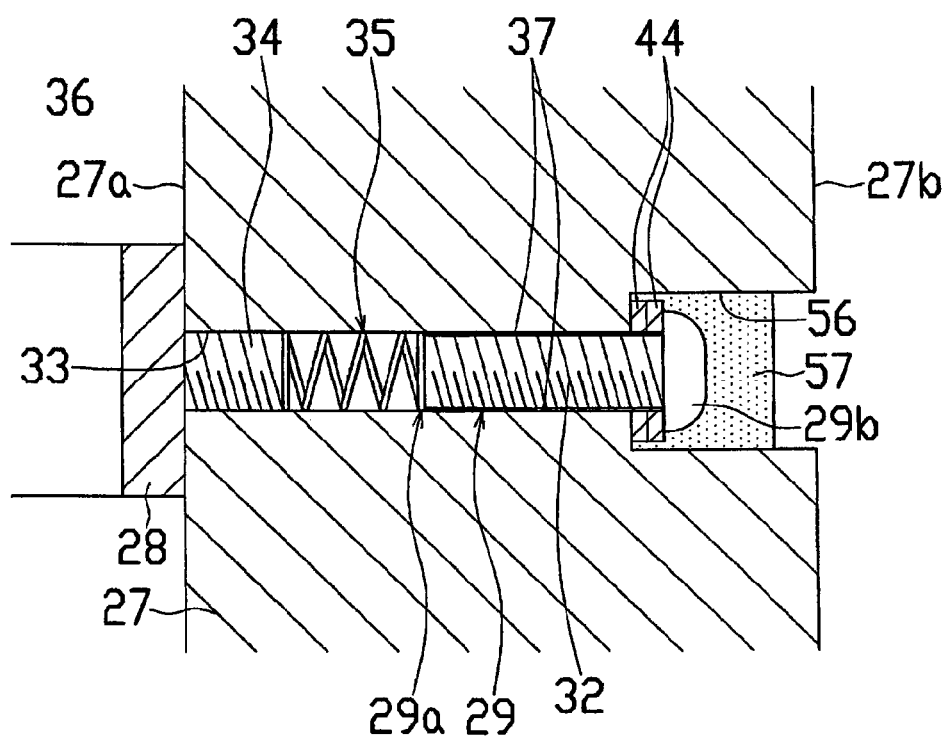
FIG. 6 is a main-part expanded view of the vicinity of a terminal bolt.

As shown in FIGS. 5 and 6, a male screw portion 32 of a terminal bolt 29 is screwed and fixed into each bolt hole 33 formed so as to penetrate the acceleration tube body 27 in its diameter direction. It is to be noted that a female screw (not shown) to which the male screw portion 32 of the terminal bolt 29 is screwed and fixed is formed in a predetermined range on the periphery of the terminal bolt 29 in the bolt hole 33.

The end (front end) 29a of this terminal bolt 29 is electrically connected to the acceleration electrode 28 via an implanted bolt [(so called worm screw) spacer] 34 and a coil spring (spring member) 35. It should be noted that the above-mentioned female screw is not formed in the periphery of the implanted bolt 34 in the bolt hole 33.

Since the coil spring 35 is inserted in a compressed state between the end 29a of the terminal bolt 29 and the implanted bolt 34, the implanted bolt 34 is biased so as to be pressure-welded to the outer peripheral face of the acceleration electrode 28. With the coil spring 35 interposed between the terminal bolt 29 and the acceleration electrode 28 as described above, the acceleration electrode 28 can be solidly supported. It should be noted that the spring member may be a plate spring, a volute spring, a whirling spring or the like, other than the coil spring 35. The spacer may be a metal-made round bar or the like other than the implanted bolt 34.

Although the terminal bolt 29 may be made in intimate contact with the acceleration tube body 27 such that an inner space 36 of the acceleration tube body 27 is brought into a high vacuum state, as shown in FIG. 6, making the terminal bolt 29 in intimate contact with the acceleration tube body 27 via an adhesive 37 for sealing allows reliable sealing between the acceleration tube body 27 and the terminal bolt 29.

Figure 8:
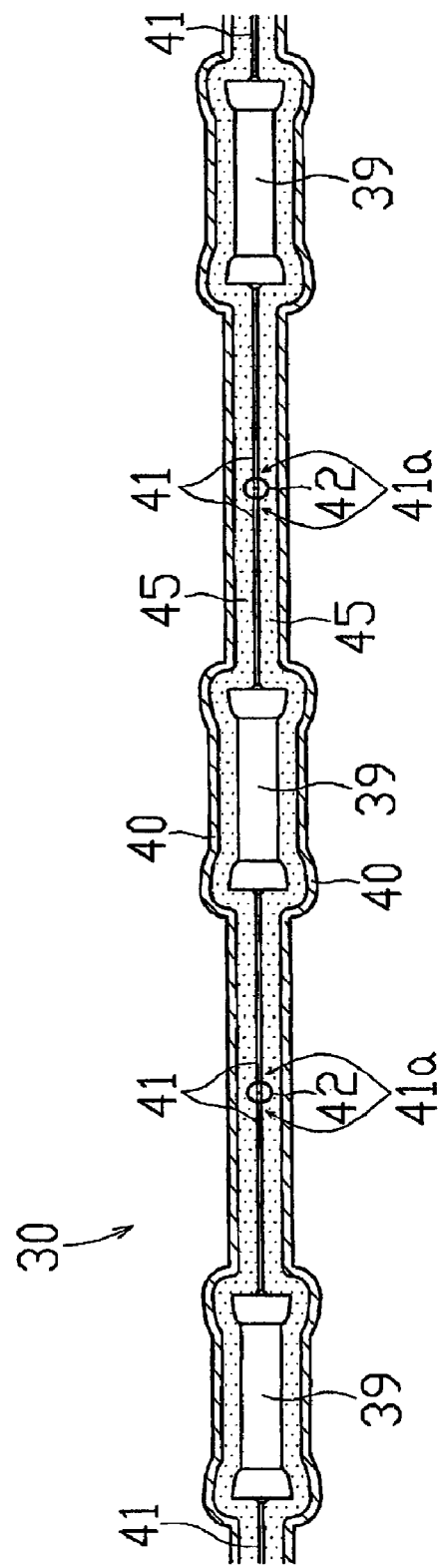
FIG. 8 is a main-part expanded sectional view of voltage dividing resistors.

As shown in FIG. 8, a voltage dividing resistor 30 is formed by serially connecting a plurality of resistors 39 and covering those plurality of resistors 39 by an insulating heat-shrinkable tube 40 extending in the connecting direction. Examples of the resistors 39 may include: a resin-coated carbon film resistor whose surface is coated by a synthetic resin; a resin-coated metal oxide film resistor; and a resin-molded carbonaceous mixture resistor whose surface is covered by a mixture of a carbon powder and a synthetic resin. The plurality of resistors 39 are serially connected by bonding ends 41a of lead wires 41, provided at the end portions of the resistors 39 in the longitudinal direction, by means of a bonding member 42 such as a solder (white lead).

Figure 9:
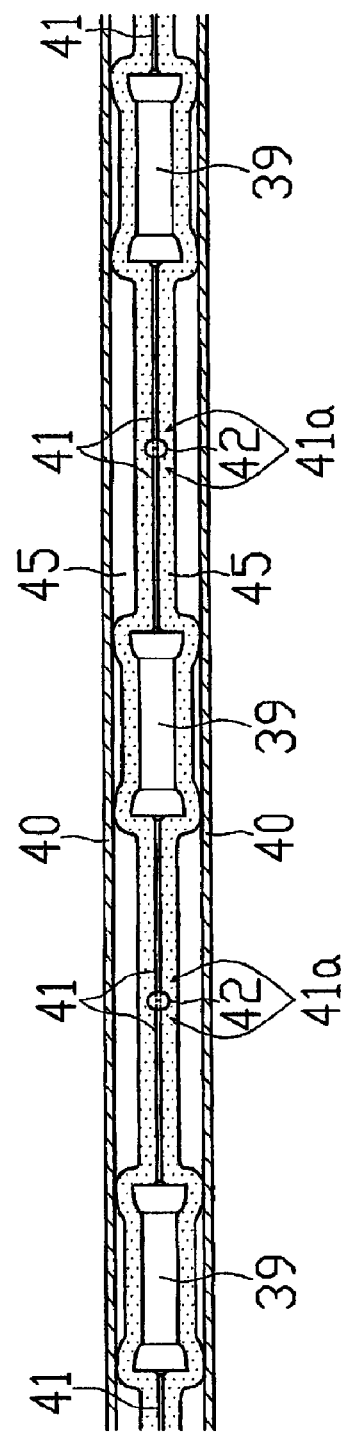
FIG. 9 is a main-part sectional view showing a state where a plurality of resistors covered by an insulating gel is inserted in an insulating heat-shrinkable tube.
Figure 10:
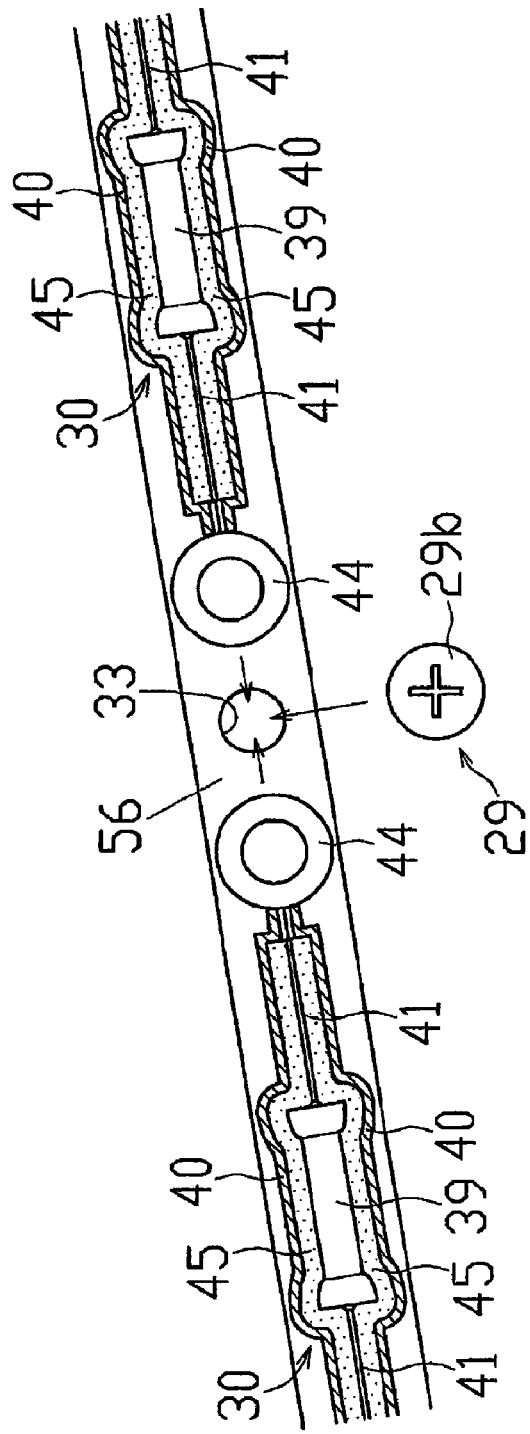
FIG. 10 is an explanatory view showing a condition where connectors provided between the ends of adjacent two voltage dividing resistors are interposed so as to be superimposed between the head of a terminal bolt and an acceleration tube body.

The insulating heat-shrinkable tube 40 is comprised of polytetrafuloroethylene [PTFE, e.g. Teflon (brand name)], polyethylene (PE), or the like. The plurality of resistors 39 are covered by the insulating heat-shrinkable tube 40 in such a manner that the plurality of serially connected resistors 39 are inserted into the cylindrically formed insulating heat-shrinkable tube 40 as shown in FIG. 9, and the insulating heat-shrinkable tube 40 is compressed by heating so as to be brought into intimate contact with the surfaces of the plurality of serially connected resistors 39 and the like as shown in FIG. 8.

The voltage dividing resistors 30 as thus described are spirally continued on the outer peripheral face 27b of the acceleration tube body 27 by being wound around a half circle of the spiral, as shown in FIGS. 4, 6, 7 and 10. A head (rear end) 29b of the terminal bolt 29 is electrically connected to each connector (connecting point) 44 provided at the end portion of the voltage dividing resistors 30 (see FIGS. 6 and 10). The head 29b of the terminal bolt 29 is electrically connected to the connector 44 by interposing the connector 44 between the head 29b of the terminal bolt 29 and the acceleration tube body 27. The head 29b of the terminal bolt 29 is electrically connected to the connector 44 of the adjacent two voltage dividing resistors 30 by interposing each of the connectors 44 between the head 29b of the terminal bolt 29 and the acceleration tube body 27 such that the connectors 44 are superimposed one after another. The shape of the connector 44 may be a U-shape, an angled U-shape or the like, other than the round shape as in FIG. 10.

Since the plurality of resistors 39 are covered by the insulating heat-shrinkable tube 40, the voltage dividing resistor 30 has an advantage of preventing a surface leak current from flowing across the surfaces of the resistors 39. Here, when the plurality of resistors 39 are covered by an insulating gel 45 and then covered by the insulating heat-shrinkable tube 40 via the insulating gel 45, it is possible to more effectively prevent the surface leak current from flowing across the surfaces of the resistors 39. Examples of the insulating gel 45 may include silicone rubber, silicone, and polytetrafuloroethylene [PTFE, e.g. Teflon (brand name)]. Examples of the method for covering the plurality of resistors 39 by the insulating gel 45 may include splay coating and powder coating. Further, the resistors 39 whose surface are not coated by a coating material have an advantage of more reliably preventing the surface leak current from flowing across the surfaces of the resistors 39 than those whose surfaces are coated by a coating material.

As shown in FIG. 3, the inner space 36 of the acceleration tube body 27 is communicated with the inside of a vacuum container 49 via a communication hole 48 provided in a table member 47 and a communication hole 50 provided in the vacuum container 49, and when the accelerator 26 as thus configured is operated, the inner space 36 is depressurized into a high vacuum state with the use of a rotary pump and the vacuum cylinder 51 such as a turbo pump.

In such a state, when a raw material, e.g. a raw material gas G such as hydrogen (H), helium (He), boric acid (B), nitrogen (N), phosphorus (P) or aluminum (Al), is supplied from the gas cylinder 3 to the ion source 2, and a predetermined high voltage (e.g. about 100 kV) is applied from the voltage source, the ions I are emitted from the ion source 2 so as to flow downward in the inner space 36 of the acceleration tube body 27 in agreement with its center shaft. It is to be noted that the charged particles emitted from the ion source (charged particles source) 2 are not restricted to the ions I, but electrons or the like can naturally be emitted. Further, the surface of a solid raw material may be sputtered to emit ions as described above.

Meanwhile, when an acceleration voltage V is applied between the top acceleration electrode 28 and the bottom acceleration electrode 28 in the acceleration tube body 27, the acceleration voltage V is divided into the acceleration electrodes 28 by the plurality of voltage dividing resistors 30. A connecter provided at the end portion of the electrode for applying the acceleration voltage V may be interposed each between the head 29b of the top terminal bolt 29 and the acceleration tube body 27 and between the head 29b of the bottom terminal bolt 29 and the acceleration tube body 27. The ions I emitted from the ion source 2 is accelerated in multiple stages by the divided voltage of the acceleration voltage V applied to each of the acceleration electrodes 28 in the inner space 36 of the acceleration tube body 27 which was depressurized into the high vacuum state. The accelerated ions I can be inputted into the vacuum container 49 through the communication hole 48 in the table member 47 and the communication hole 50 in the vacuum container 49, to be used for modifying the surfaces of a variety of materials housed in the vacuum container 49 or for some other purposes. Although a value of the acceleration voltage V is not particularly restricted, it is appropriately on the order of several dozen to 100 kV.

Figure 11:
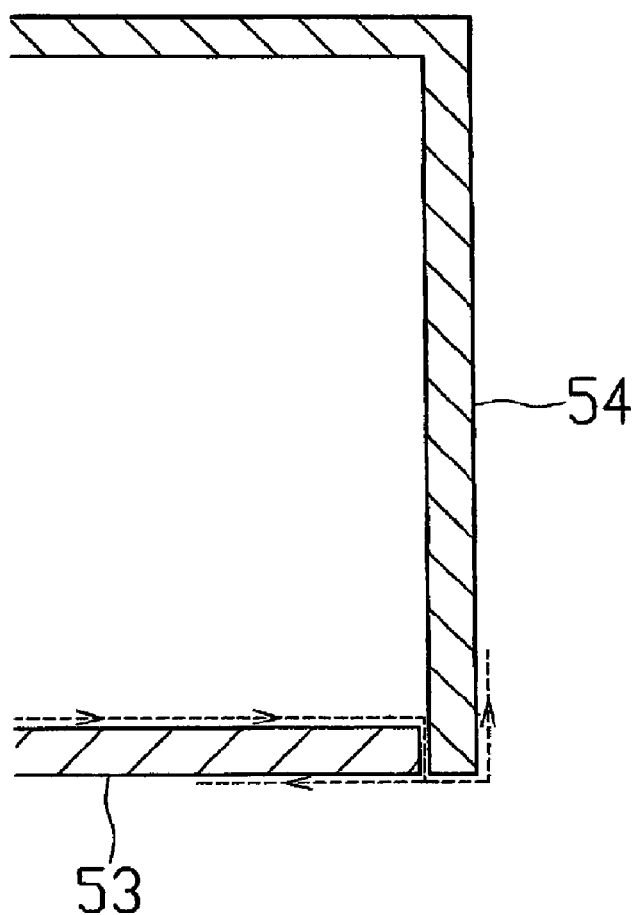
FIG. 11 is a view showing one example of a channel along which a leak current flows in a charged particle generator where an ion source is covered by a cover body having an opening at its bottom.

Since a high voltage is typically applied to the ion source when the accelerator functions as described above, discharge may occur and a leak current (surface leak current) may flow along a container housing the ion source. FIG. 11 is a main-part expanded sectional view of a conventional ion generator which is configured such that a table member 53 with an ion source placed thereon is covered by a cover body 54 having an opening at its bottom. As shown in the figure, the leak current having flowed along the surface of the table member 53 with the ion source (not shown) placed thereon may flow along the rear face of the table member 53 or the outer side face of the cover body 54 via a joint portion between the table member 53 and the cover body 54.

Figure 12:
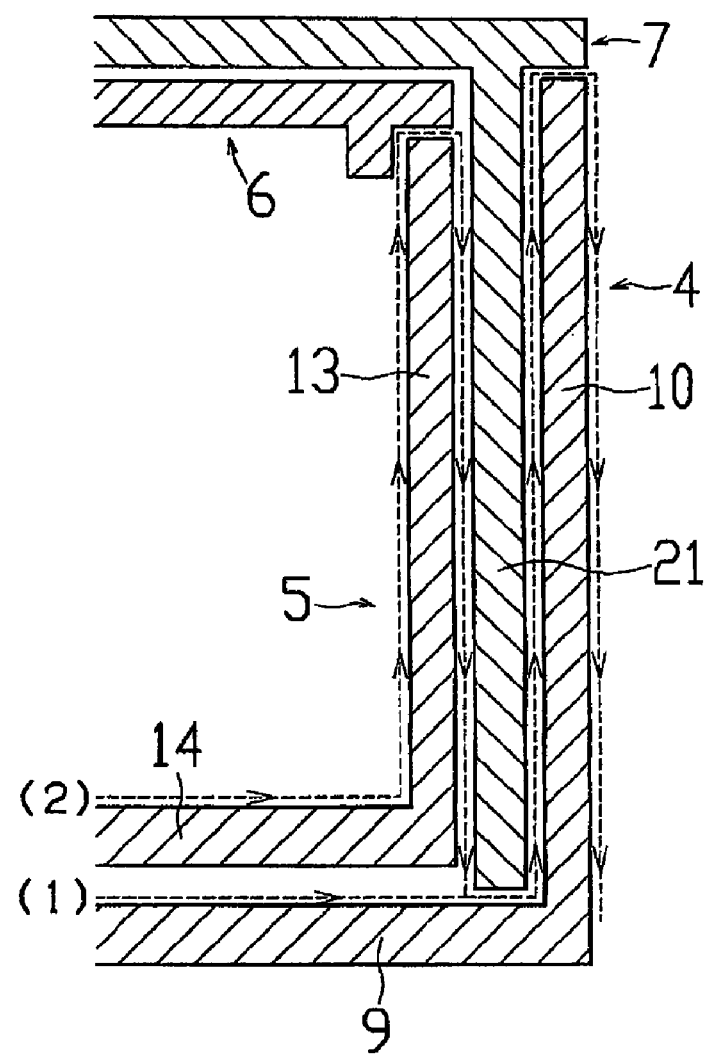
FIG. 12 is an explanatory view showing one example of a channel along which a leak current flows, assuming that discharge is generated in the charged particle generator according to the present embodiment.

FIG. 12 is a main-part expanded sectional view of the vicinity of the side walls of the box-shaped insulating members in the charged particle generator 1 according to the present embodiment. It is to be noted that in this figure, the box-shaped insulating members are shown with spacings for the sake of explanation. As shown with (1) in the figure, when assuming that a leak current flows along the upper face of the bottom portion 9 of the first box-shaped insulating member 4, the leak current reaches the end portion of the upper face, subsequently flows upward between the outer side face of the side wall 21 of the inverted box-shaped insulating member 7 and the inner side face of the side wall 10 of the first box-shaped insulating member 4, and then flows along the outer side face of the side wall 10 of the first box-shaped insulating member 4.

Further, as shown with (2) in the figure, when assuming that the leak current flows along the upper face of the bottom portion 14 of the second box-shaped insulating member 5, the leak current flows along the upper face of the bottom portion 14 of the second box-shaped insulating member 5 to reach the edge of the upper face, subsequently flows upward along the inner side face of the side wall 13, and then flows downward in the figure between the outer side face of the side wall 13 of the second box-shaped insulating member 5 and the inner side face of the side wall 21 of the inverted box-shaped insulating member 7. Thereafter, the leak current flows upward between the outer side face of the side wall 21 of the inverted box-shaped insulating member 7 and the inner side face of the side wall 10 of the first box-shaped insulating member 4, and then flows along the outer side face of the side wall 10 of the first box-shaped insulating member 4.

Further, as shown in FIGS. 1 and 3, a side wall member 55 extending downward from the opening edge of the bottom portion 9 of the first box-shaped insulating member 4 is formed on the bottom portion 9 of the first box-shaped insulating member 4. Therefore, when assuming that the leak current flows along the side wall member 55, the current flows downward along the inner side face of the side wall member 55, and subsequently flows upward along the outer side face of the side wall member 55.

As apparent from these explanations, in the charged particle generator 1 according to the present embodiment, it is possible by application of a high voltage between the ion source 2 and the accelerator 26 to prevent to a minimum the leak current from reaching the outside even if the leak current flows. In other words, in the ion generator as shown in FIG. 11, even when a voltage having intensity such that the leak current flows outside as thus described is supplied to the ion source 2 of the charged particle generator 1 according to the present embodiment, since the channel from the ion source 2 to the outside (outer side face) of the first box-shaped insulating member 4 is long, it is possible to prevent the leak current from flowing to the outside of the first box-shaped insulating member 4 after generation of discharge. Hence there is an advantage that it is not necessary to support the first box-shaped insulating member 4 as a container for housing the ion source 2 and the like by means of an insulator for preventing discharge. It should be noted that the designed sizes of the first box-shaped insulating member 4, the second box-shaped insulating member 5, the insulating lid member 6 and the inverted box-shaped insulating member 7 can be changed to appropriate values according to a value of a voltage supplied from the voltage source to the ion source 2.

It should be noted that, although the charged particle generator 1, comprising one inverted box-shaped insulating member 7 where one second box-shaped insulating member 5 is housed inside the first box-shaped insulating member 4 and the side walls 21 are inserted into the side walls 13 and 10 of these adjacent box-shaped insulating members, was described in the present embodiment, the numbers of second box-shaped insulating members 5 and inverted box-shaped insulating members 7 are not restricted to those in the present embodiment. For example, two second box-shaped insulating members 5 may be housed inside the first box-shaped insulating member 4, and two inverted box-shaped insulating members 7 may close the inner spaces of those members. Further, the channel from the charged particle source to the outside is longer in a configuration where multiple box-shaped insulating members and inverted box-shaped insulating members are alternately used, thereby allowing enhancement of the discharge preventing effect. The numbers of box-shaped insulating members and inverted box-shaped insulating members used in the above configuration are selected to be at least one or more, and these are also included in the present invention.

Namely, a second box-shaped insulating member in the same shape as and a different size from the second box-shaped insulating member 5 shown in FIG. 1 is housed inside the second box-shaped insulating member 5, the ion source 2 and the like are installed inside the interiorly housed second box-shaped insulating member, and the inner space is closed by the inverted box-shaped insulating member 7 and an inverted box-shaped insulating member having an opening at its bottom such that each of its side walls is inserted into the space between the side wall 13 of the second box-shaped insulating member 5 shown in the figure and the side wall of the interiorly housed second box-shaped insulating member.

In this case, although a higher discharge preventing effect can be obtained due to a longer channel from the ion source 2 to the outside than in the charged particle generator 1 shown in FIG. 1, the cost of the generator becomes high, and therefore, the numbers of second box-shaped insulating members 5 and inverted box-shaped insulating members 7 may be determined according to the cost of the generator, a value of a voltage to be supplied to the ion source 2, and the like.

In addition, although the simple configuration can lead to effective prevention of the surface leak current from flowing to the outside in the charged particle generator 1 according to the present embodiment, a high voltage is applied from the voltage source to the ion source 2, and hence the inner space between the first and second box-shaped insulating members 4 and 5 may be filled with a voltage resistant insulating gas (e.g. SF6) so as to further improve the discharge preventing effect. In that case, for preventing the voltage resistant insulating gas from flowing outside, the space between the emerging holes 11 and 17 of the first box-shaped insulating member 4 and the second box-shaped insulating member 5 and the inner space of the insertion member 12 where the power source supply line or a variety of control lines are penetrated are closed by an appropriate closing member.

Further, as shown in FIGS. 4, 6, 7 and 10, there is an advantage that, when a plurality of voltage dividing resistors 30 are housed in filling grooves 56 formed so as to extend spirally on the outer peripheral face 27b of the acceleration tube body 27 and the filling grooves 56 are filled with an insulating gel 57, the acceleration tube 25 can be further reduced in size, thereby to further enhance the insulating effect and more effectively prevent the surface leak current from flowing along the surfaces of the voltage dividing resistors 30. In this case, the bolt holes 33 are provided so as to communicate the inner space 36 of the acceleration tube body 27 and the filling grooves 56. Examples of the insulating gel 57 may include silicone rubber, silicone, and polytetrafuloroethylene [PTFE, e.g. Teflon (brand name)].

Figure 7:
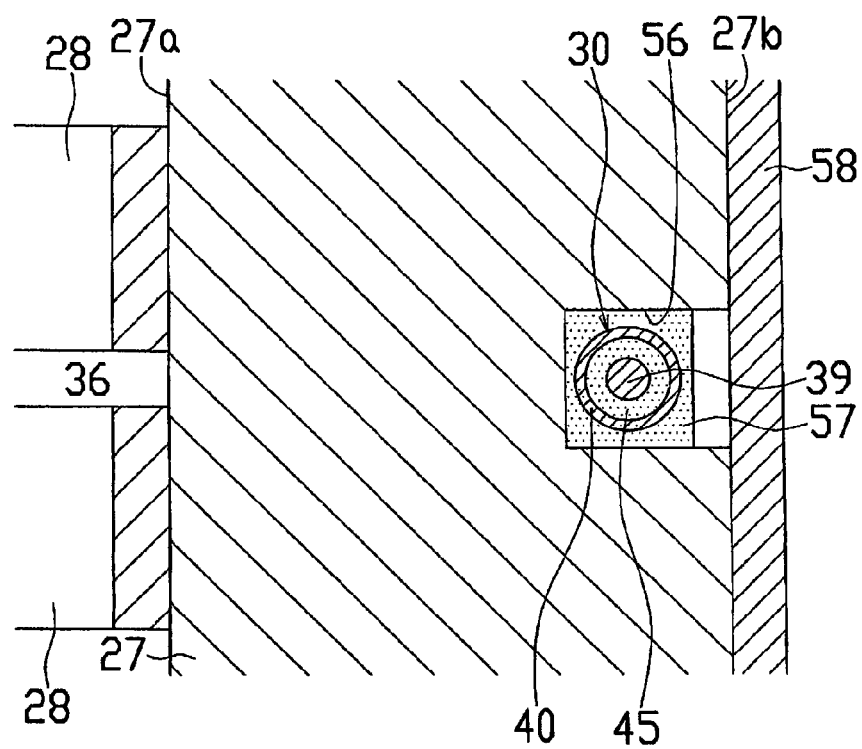
FIG. 7 is a main-part expanded sectional view along a line A-A of FIG. 5.

Further, as shown in FIG. 7, when the outer peripheral face 27b of the acceleration tube body 27 is covered by an insulating cover 58, the whole acceleration tube can be shielded from a high voltage, whereby it is advantageously possible to keep the safety of the user. Examples of the material for the insulating cover 58 may include polytetrafuloroethylene [PTFE, e.g. Teflon (brand name)], polyethylene (PE), polypropylene (PP), polystyrene (PS), silicone rubber, and silicone.

INDUSTRIAL APPLICABILITY

The present invention is applicable to a charged particle generator for generating charged particles and an accelerator (e.g. ion implanter) comprising the generator and an accelerator.

DRAWINGS

FIG. 1
1 Charged particle generator
2 Charged particle source (Ion source)
4 First box-shaped insulating member
5 Second box-shaped insulating member
6 Insulating lid member
7 Inverted box-shaped insulating member FIG. 3
1 Vacuum pump

The invention claimed is:

1. A charged particle generator, characterized in that a charged particle source is provided inside an insulating member comprised of:
   a first box-shaped insulating member, having an opening at its top;
   one or more interiorly housed insulating members, each of which is housed inside said first box-shaped insulating member and has an opening at its top, and whose side walls and bottom portions are spaced at a predetermined distance from the outside adjacent side walls and bottom portion of said first box-shaped insulating member; and
   one or more inverted box-shaped insulating members, each having an opening at its bottom such that each of its side walls is inserted into the space between the side walls of said first box-shaped insulating member and said one or more interiorly housed box-shaped insulating member.

2. A charged particle generator, comprising:
   a first box-shaped insulating member, having an opening at its top;
   a second box-shaped insulating members, which is housed inside said first box-shaped insulating member and has an opening at its top, and whose side walls and bottom portion are spaced at a predetermined distance from the outside adjacent side walls and bottom portion of said first box-shaped insulating member; and
   an inverted box-shaped insulating members, having an opening at its bottom such that each of its side walls is inserted into the space between the side walls of said first and second box-shaped insulating members,
   characterized in that charged particles generated from a charged particle source installed inside said second box-shaped insulating member are emitted through emerging holes formed in the bottom portions of said first and second box-shaped insulating members.

3. The charged particle generator according to claim 2, characterized by further comprising an insulating lid member whose edge is placed on the upper end of the side wall of said second box-shaped insulating member so as to close said top-opening of said second box-shaped insulating member.

4. The charged particle generator according to claim 3, characterized in that said first box-shaped insulating member, said second box-shaped insulating member, said insulating lid member and said inverted box-shaped insulating member are formed of polypropylene or polyethylene.

5. An accelerator, comprising: the charged particle generator according to any one of claims 1 to 4; and an acceleration tube for accelerating charged particles, emitted from said generator, by application of an acceleration voltage,
   characterized by comprising:
   a cylindrically formed acceleration tube body made of a synthetic resin;
   a plurality of ring-shaped acceleration electrodes provided as arranged in a row in a direction of a shaft center of said acceleration tube body at predetermined spacings on the inner peripheral face of said acceleration tube body;
   a voltage dividing resistor for an acceleration tube, which serially connects a plurality of resistors, covers the plurality of resistors by an insulating heat-shrinkable tube extending in the connecting direction, and is spirally wound on the outer peripheral face of said acceleration tube body; and
   a plurality of terminal members, which are provided through said acceleration tube body in its diameter direction and in intimate contact with said acceleration tube body, whose front ends are electrically connected to said acceleration electrodes, and whose rear ends are electrically connected to connecting points of said voltage dividing resistors for an acceleration tube.

* * * * *